United States Patent
Ogata et al.

(10) Patent No.: US 8,342,837 B2
(45) Date of Patent: Jan. 1, 2013

(54) RESIN SEALING APPARATUS

(75) Inventors: Kenji Ogata, Ogori (JP); Shin Nagaoka, Ogori (JP)

(73) Assignee: Dai-Ichi Seiko Co., Ltd., Kyoto-Shi, Kyoto (JP)

( * ) Notice: Subject to any disclaimer, the term of this patent is extended or adjusted under 35 U.S.C. 154(b) by 341 days.

(21) Appl. No.: 12/438,535

(22) PCT Filed: Sep. 13, 2007

(86) PCT No.: PCT/JP2007/067835
§ 371 (c)(1),
(2), (4) Date: Feb. 23, 2009

(87) PCT Pub. No.: WO2008/035613
PCT Pub. Date: Mar. 27, 2008

(65) Prior Publication Data
US 2010/0247697 A1    Sep. 30, 2010

(30) Foreign Application Priority Data
Sep. 19, 2006    (JP) .................................. 2006-252936

(51) Int. Cl.
*B29C 45/00* (2006.01)
(52) U.S. Cl. ...................... 425/544; 425/129.1; 425/116
(58) Field of Classification Search ................ 425/129.1, 425/544, 116
See application file for complete search history.

(56) References Cited

U.S. PATENT DOCUMENTS

| 3,743,469 A | * | 7/1973 | Gibbons | .................... 425/451.2 |
| 4,768,946 A | * | 9/1988 | Maruyama et al. | ........... 425/595 |
| 5,209,889 A | * | 5/1993 | Brown et al. | .............. 264/297.2 |
| 5,770,128 A | * | 6/1998 | Kobayashi et al. | ............. 264/39 |

(Continued)

FOREIGN PATENT DOCUMENTS
EP    1238775 A1    9/2002
(Continued)

OTHER PUBLICATIONS

Japanese Office Action issued on Nov. 24, 2010 in corresponding Japanese Patent Application No. 2008-501094.

*Primary Examiner* — Joseph Del Sole
*Assistant Examiner* — David N Brown, II
(74) *Attorney, Agent, or Firm* — Birch, Stewart, Kolasch & Birch, LLP

(57) ABSTRACT

There are provided a first mold 2 and a second mold 1 that can be brought into and released from contact with the first mold 2. A substrate 70 provided in both the molds 1, 2 and mounted with electronic components is subjected to resin sealing and molding by filling with resin of cavities formed by both the molds 1, 2. The second mold 1 is placed on a base plate 9 so as to be capable of horizontally reciprocating, and has a cavity block 7 that can be brought into and released from contact with the first mold 2 and a mold clamping mechanism 16 that supports the cavity block 7 and that brings and releases the cavity block 7 into and from contact with the first mold 2 so as to perform mold clamping. On the base plate 9 is provided a horizontal actuation mechanism 11 for moving the second mold 1 to a facing position where the second mold 1 faces the first mold 2 and to a non-facing position where the second mold 1 has been moved sideways from the facing position.

8 Claims, 13 Drawing Sheets

U.S. PATENT DOCUMENTS

| | | | | |
|---|---|---|---|---|
| 6,129,883 A | * | 10/2000 | Jacovich et al. | 264/297.3 |
| 6,688,871 B1 | * | 2/2004 | Lee et al. | 425/129.1 |
| 2002/0025352 A1 | * | 2/2002 | Miyajima | 425/89 |
| 2006/0013908 A1 | | 1/2006 | Ogata et al. | |

FOREIGN PATENT DOCUMENTS

| | | |
|---|---|---|
| JP | 6-252192 A | 9/1994 |
| JP | 11-156882 A | 6/1999 |
| JP | 2000-77445 A | 3/2000 |
| JP | 2000-232116 A | 8/2000 |
| JP | 2002-83834 A | 3/2002 |
| JP | 2002-154118 A | 5/2002 |
| JP | 2004-71704 A | 3/2004 |
| JP | 2005-129783 A | 5/2005 |
| JP | 2006-32597 A | 2/2006 |
| WO | WO-01/43942 A1 | 6/2001 |

\* cited by examiner (a)

(b)

(a)

(b)

RESIN SEALING APPARATUS

BACKGROUND OF THE INVENTION

The present invention relates to a resin sealing apparatus.

Conventionally, there have been resin sealing apparatuses in which an upper mold and a lower mold are opened and closed by actuation of a mold clamp actuation device and in which a lower-mold mount plate supporting the lower mold is shuttled back and forth by a shuttling servo motor so that operations of supplying material and removing a molded product can be performed without great vertical separation between the upper and lower molds (see Patent Document 1, for instance).

[Patent Document 1] JP H06-252192 A

SUMMARY OF THE INVENTION

The conventional resin sealing apparatuses, however, are configured so that the lower mold and the lower-mold mount plate supporting the lower mold are moved up and down as a whole by a vertical actuation device using a servo motor. Accordingly, the apparatuses are increased in size and cost.

An object of the present invention is to provide a resin sealing apparatus in which a configuration required for mold clamping can be reduced in size and can be manufactured at low cost while an amount of opening of molds is made small.

As means for accomplishing the object, the invention provides:

a resin sealing apparatus having a first mold, and a second mold that can be brought into and released from contact with the first mold, wherein at least one substrate provided in both the molds and mounted with electronic components is subjected to resin sealing and molding by filling with molten resin material of cavities formed by both the molds, the second mold placed on a base plate so as to be capable of horizontally reciprocating, and having a cavity block that can be brought into and released from contact with the first mold, and a mold clamping mechanism that brings and releases the cavity block into and from contact with the first mold so as to perform mold clamping, the base plate provided with a horizontal actuation mechanism for moving the second mold to a facing position where the second mold faces the first mold and to a non-facing position where the second mold has been moved sideways from the facing position.

In this configuration, only the cavity block that is part of the second mold is required to be actuated for mold clamping. Thus forces required for mold clamping can be reduced in comparison with configurations in which the whole second mold is actuated. As a result, the apparatus can be produced with reduced size and at low cost.

The mold clamping mechanism preferably has a configuration including at least one piston that supports the cavity block and that brings and releases the cavity block into and from contact with the first mold so as to perform mold clamping.

The mold clamping mechanism may have:

a first taper block provided on the cavity block and having a slant surface formed on a bottom face thereof, second taper blocks provided so as to be capable of horizontally reciprocating and having slant surfaces formed on top faces thereof that are to be in slide contact with the slant surface of the first taper block so as to move up and down the cavity block through the first taper block, and actuation means for horizontally reciprocating the second taper blocks.

Preferably, the base plate has a vertical actuation mechanism that actuates the cavity block independently from the mold clamping mechanism so as to bring and release the cavity block into and from contact with the first mold at speeds higher than the mold clamping mechanism, and the vertical actuation mechanism and the second mold have joints that become linked status in the facing position and that become unlinked status in the non-facing position.

This configuration makes it possible to horizontally move only the second mold between the facing position and the non-facing position with respect to the first mold, and does not require movement of the vertical actuation mechanism. The second mold and the vertical actuation mechanism can be linked to each other by the joints, only with the second mold moved horizontally to the facing position with respect to the first mold.

The cavity block is shaped like a rectangular parallelopiped having four side surfaces. The second mold preferably has a holder base having guide surfaces that guide the four side surfaces of the cavity block in a slidable manner.

This configuration makes it possible to improve accuracies of components by simple processing. Besides, tie bars that are conventionally necessary and indispensable are made unnecessary, and thus a mold clamping structure can be simplified so as to have a low-cost configuration.

The holder base preferably has an adjustment spacer that forms the guide surfaces and that is composed of separate members.

When the cavity block is moved, in this configuration, smooth movement of the cavity block can be attained while adequate spacings are maintained between the side surfaces of the cavity block and the guide surfaces of the holder base.

The cavity block may be composed of a plurality of blocks supported by at least one piston.

The substrates each may correspond to one molded product.

Preferably, either one of the molds has a pot part for melting resin material, and the pot part has openings that are formed so as to face the substrates provided in both the molds.

This configuration makes it possible not only to attain integral formation without overflow of unnecessary solidified resin from inserts but also to save mold clamping forces. As a result, size of the resin sealing apparatus can be decreased.

In the invention, only the cavity block that is part of the second mold is required to be actuated for mold clamping, and thus mold clamping mechanisms and the like on grand scale are unnecessary. Therefore, the apparatus can be reduced in size and manufactured at low cost. Besides, the molds can be opened and closed at high speed by the vertical actuation mechanism. Accordingly, reduction in processing time and improvement in efficiency of molding cycle are attained, so that molded products can be obtained at low cost.

DETAILED DESCRIPTION OF THE PREFERRED EMBODIMENTS

Figure 1:
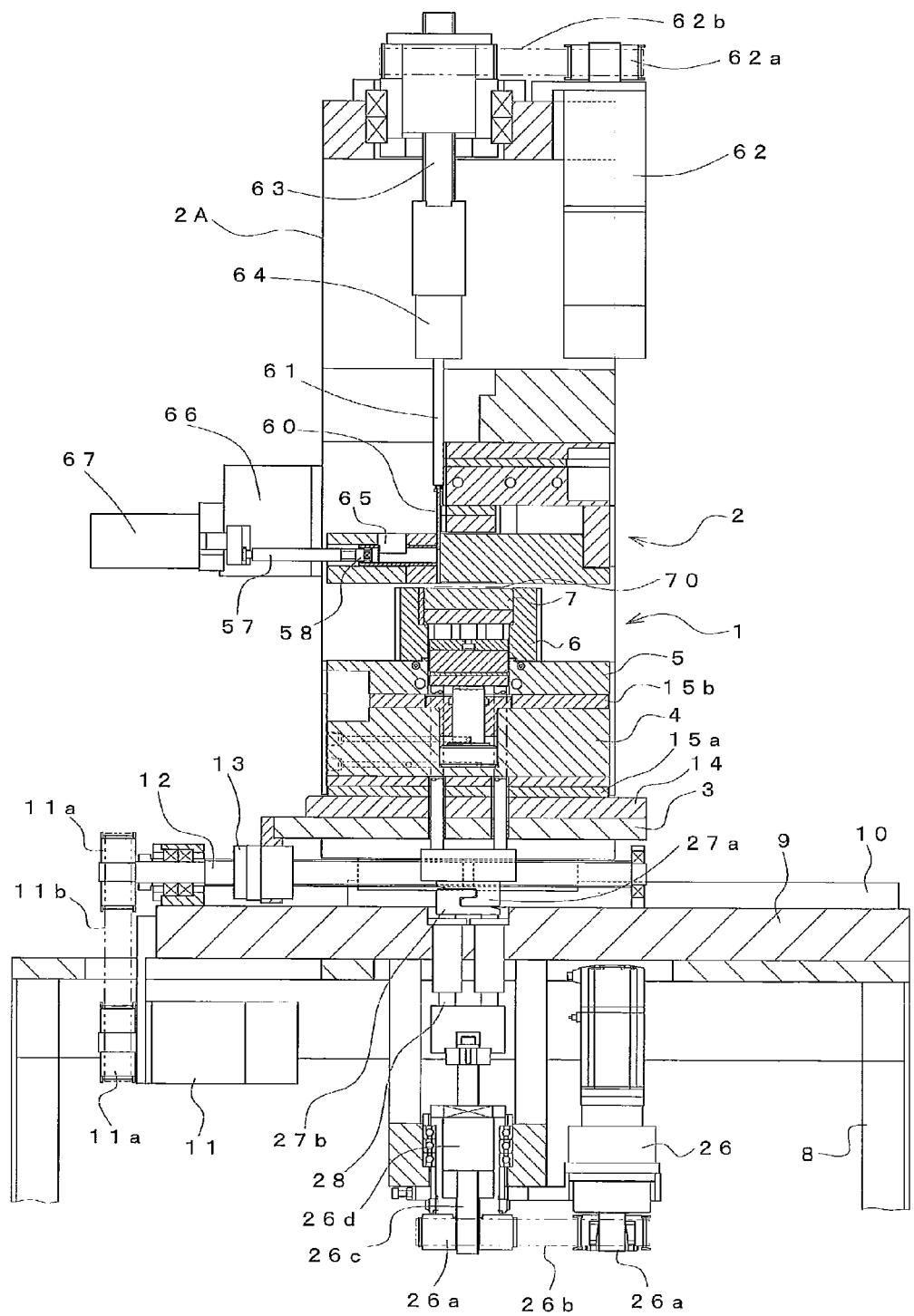
FIG. 1 is a front elevation in section of a resin sealing apparatus in accordance with the present embodiment.
Figure 2:
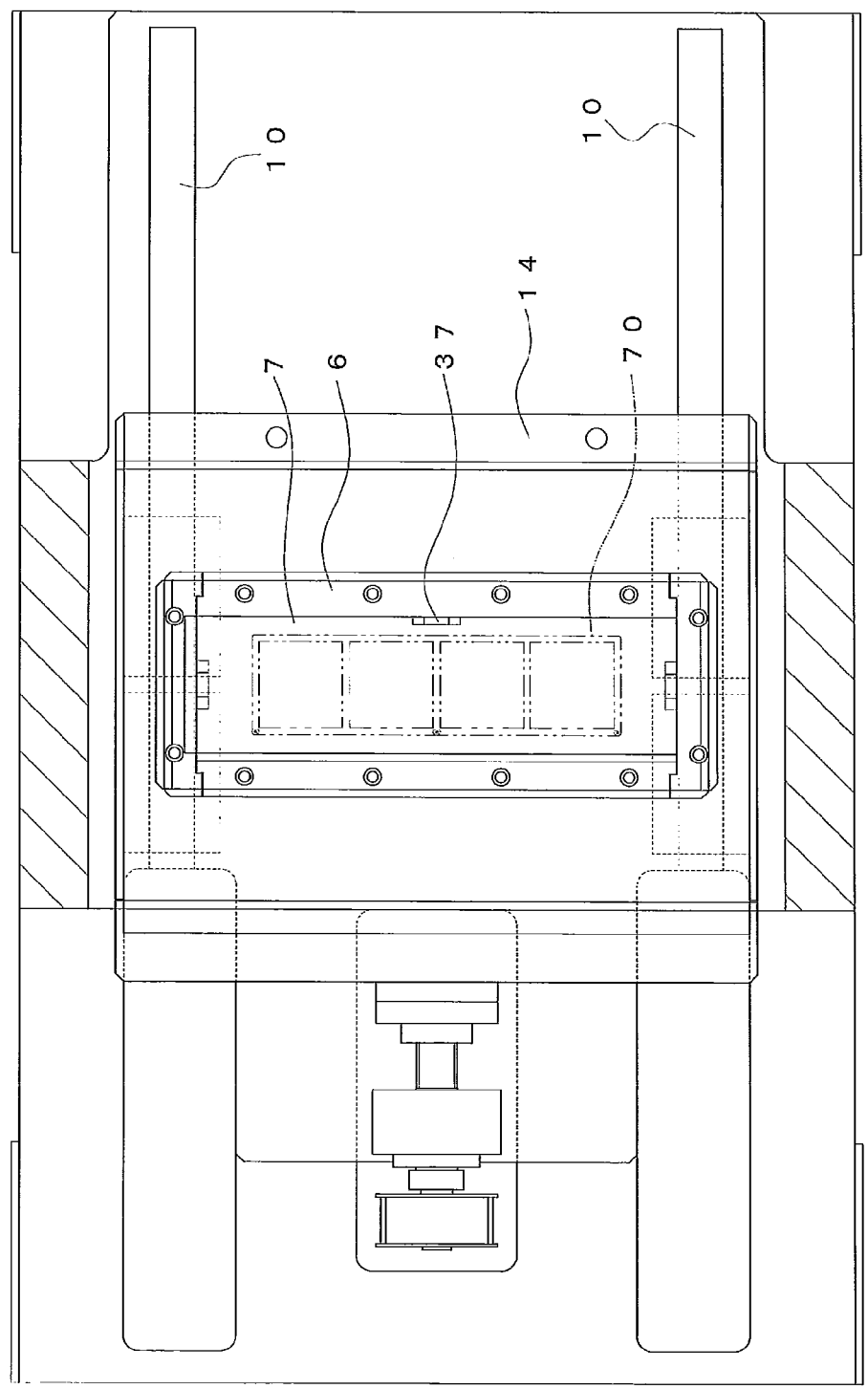
FIG. 2 is a plan view of a lower mold set in FIG. 1.

FIGS. 1 and 2 show a resin sealing apparatus in accordance with the present embodiment. The resin sealing apparatus has a lower mold set 1 and an upper mold set 2.

(1 Lower Mold Set 1)

In a general configuration of the lower mold set 1, as shown in FIG. 1, a cylinder block 4, a lower-mold frame plate 5, a lower-mold holder base 6 are stacked, in order of mention, on a top surface of a slide plate 3, and a lower-mold cavity block 7 is provided in the lower-mold holder base 6.

The slide plate 3 is placed on a base plate 9 provided on a platform 8 so as to be capable of reciprocating, so that the lower mold set 1 can be moved between a position under the upper mold set 2 and a position sideway with respect to the upper mold set 2. That is, slide guides 10 are provided on a top surface of the base plate 9, and the slide plate 3 is placed on the slide guides 10 so as to be capable of reciprocating. The slide plate 3 is reciprocated by operation of a first servo motor 11 that causes rotation of a ball screw 12 through pulleys 11a and a timing belt 11b and that thereby transmits a power through a nut 13 provided on the slide plate 3.

Figure 4:
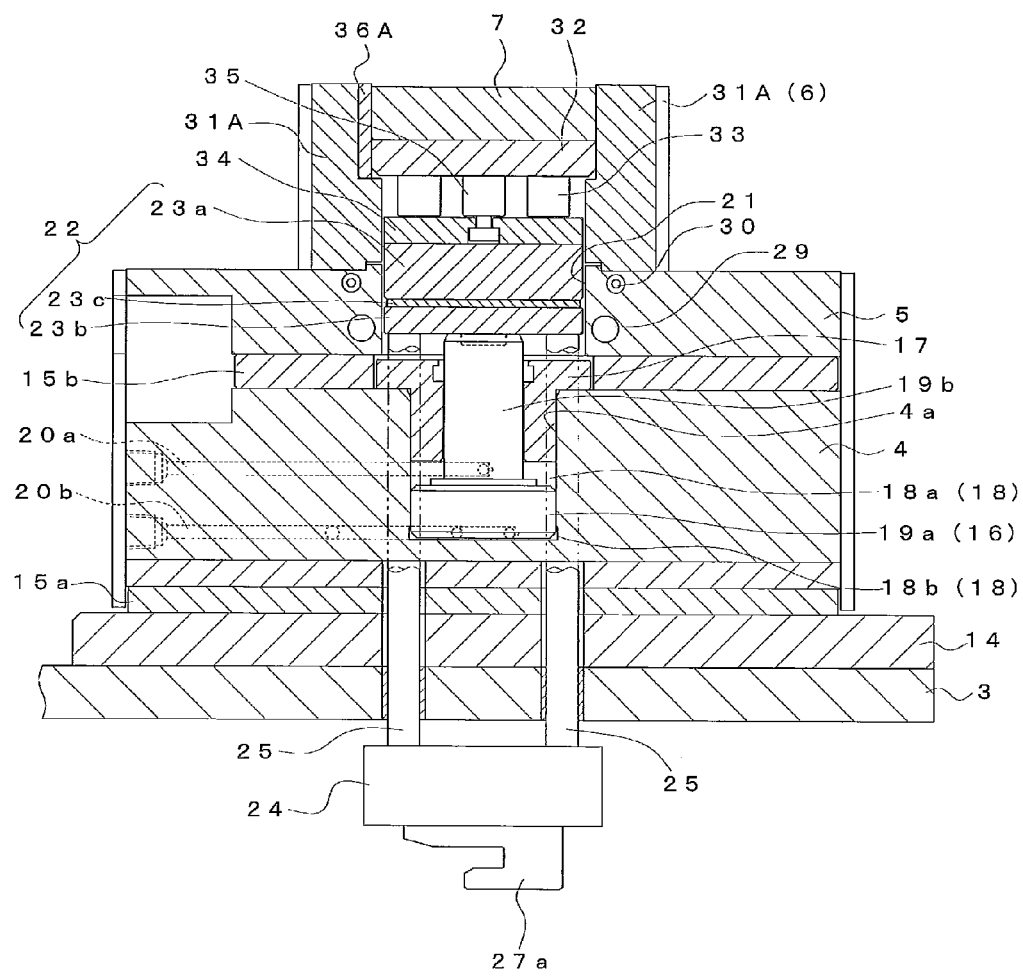
FIG. 4 is an enlarged view of the lower mold set in FIG. 1.

As shown in FIG. 4, a support plate 14 is provided on the top surface of the slide plate 3. Between the support plate 14 and the cylinder block 4 is provided a lower-mold adiabatic plate 15a. Between the cylinder block 4 and the lower-mold frame plate 5 is provided a lower-mold adiabatic plate 15b.

(1-1 Cylinder Block 4)

Figure 5:
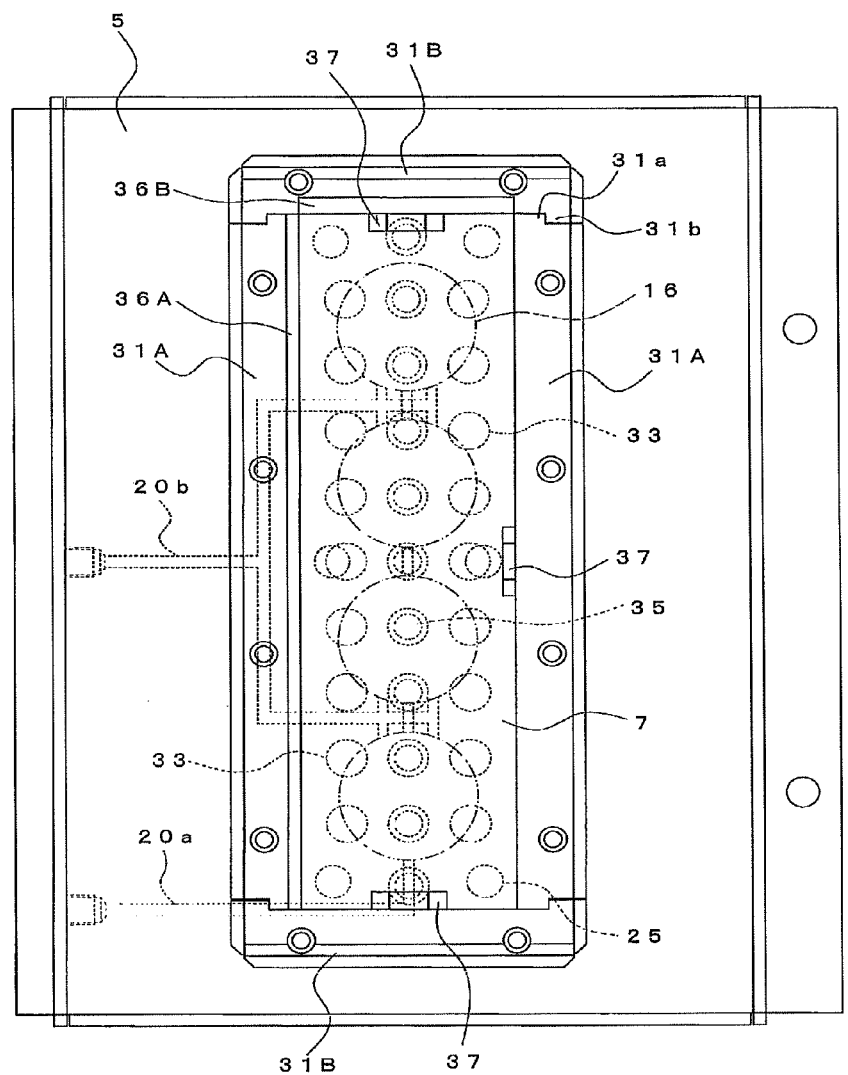
FIG. 5 is a plan view of FIG. 4.

As shown in FIG. 4, recesses 4a each having a circular section are formed on a top surface of the cylinder block 4. In each recess 4a is accommodated a piston 16 so as to be capable of moving up and down. An upper opening of each recess 4a is covered with a piston cover 17 so that a liquid chamber 18 is formed. The piston 16 is composed of a column-like large-diameter part 19a that moves up and down along an inner circumferential surface of the liquid chamber 18 and a small-diameter part 19b that protrudes from center of a top surface of the large-diameter part 19a. The large-diameter part 19a partitions the liquid chamber 18 into an upper liquid chamber 18a and a lower liquid chamber 18b. In adjoining liquid chambers 18, as shown in FIGS. 4 and 5, the upper liquid chambers 18a thereof communicate with each other and so do the lower liquid chambers 18b thereof. Liquid is supplied into and discharged from the upper liquid chambers 18a and the lower liquid chambers 18b through upper piping 20a and lower piping 20b, respectively. Thus uniform power can be outputted by any piston 16. The piston cover 17 is shaped like a cylinder having a brim part at upper end thereof, and the small-diameter part 19b of the piston 16 slidably penetrates through a through hole at center thereof. A circumferential groove is formed on an inner circumferential surface in vicinity of the upper end opening of the recess 4a. There is provided packing not shown in the circumferential groove so as to prevent liquid from flowing out of the upper liquid chamber 18a.

(1-2 Lower-Mold Frame Plate 5)

In the lower-mold frame plate 5, as shown in FIG. 4, openings 21 that communicate with top and bottom surfaces of the plate 5 and that are rectangular in plan view are formed and connection blocks 22 are placed therein so as to be capable of moving up and down. Each connection block 22 has a sandwich structure in which an auxiliary adiabatic plate 23c is held between upper and lower two connection plates 23a, 23b fastened with bolts. Each connection block 22 is moved up and down by a motive power transmitted from a vertical actuation mechanism through link bars 25. The link bars 25 penetrate through the cylinder block 4, the support plate 14, and the slide plate 3, and upper end faces thereof are screwed onto a bottom surface of the connection plate 23b.

The vertical actuation mechanism is composed of a series of components ranging from a second servo motor 26 to the link bars 25. That is, the link bars 25 are linked to the bottom surface of the connection block 22 and are plurally provided along both sides thereof, and a connection plate 24 is linked to lower ends of the bars. A joint 27a is integrated with a bottom surface of the connection plate 24. The joint 27a is shaped like a hook and is engaged with and linked to a joint 27b from a lateral direction so as not to be releasable in vertical directions. To the joint 27b are linked a plurality of slide shafts 28. As for the slide shafts 28, a nut 26d linked to a pulley 26a on side of a ball screw 26c is rotated by operation of the second servo motor 26, through pulleys 26a and a timing belt 26b, and the ball screw 26c is thereby moved up and down. A configuration of the joints 27a, 27b is not limited to the hook-like shape and other configurations may be employed. In short, the joints 27a, 27b have only to have a configuration in which the joints are linked in a facing position where the lower-mold cavity block 7 faces an upper-mold cavity block 46 and are unlinked in a non-facing position, with horizontal movement of the slide plate 3.

The lower-mold frame plate 5 contains a lower-mold heater 29 and a lower-mold resistance temperature sensor 30. The lower-mold heater 29 is energized to heat the lower-mold cavity block 7 through the lower-mold holder base 6. The energization of the lower-mold heater 29 is controlled on basis of a temperature detected by the lower-mold resistance temperature sensor 30 so that a temperature of the lower-mold cavity block 7 is conditioned to a predetermined value.

(1-3 Lower-Mold Holder Base 6)

As shown in FIGS. 4 and 5, the lower-mold holder base 6 is composed of four base blocks 31A, 31B that are fixed by screws onto a top surface of the lower-mold frame plate so as to be shaped like a rectangular frame. There are formed step parts 31a, 31b in both end parts of the base blocks 31A, 31B, respectively, and thus total rigidity thereof is increased by insertion of both the end parts (step parts 31a) of the long side base block 31A into both the end parts (step parts 31b) of the short side base block 31B.

(1-4 Lower-Mold Cavity Block 7)

The lower-mold cavity block 7 is generally shaped like a rectangular parallelopiped, and the cavity block 7 having a lower-mold back plate 32 integrated with a bottom surface thereof is placed in the rectangular frame of the lower-mold holder base 6 so as to be capable of moving up and down. On inside surfaces of one of the long side base blocks 31A and of one of the short side base blocks 31B are provided adjustment plates 36A and 36B, respectively. The adjustment plates 36A, 36B are intended for providing clearances that are suitable for smooth vertical movement of the lower-mold cavity block 7 in the rectangular frame of the lower-mold holder base 6. After the base blocks 31A and 31B are assembled on the top surface of the lower-mold frame plate 5, accordingly and preferably, distances between the facing inside surfaces thereof are measured and the adjustment plates 36A, 36B having thicknesses that provide the clearances that are suitable for smooth vertical movement of the lower-mold cavity block 7 are fixed to the base blocks 31A, 31B. On condition that the adjustment plates 36A, 36B are worn out in use, the plates are preferably replaced by new plates. On condition that the lower-mold cavity block 7 is worn out, the adjustment plates 36A, 36B are preferably replaced by those having larger thicknesses after the cavity block 7 is restored in flatness by grinding or the like. The adjustment plates 36A, 36B may be provided not only on the two side surfaces but also on the remaining two side surfaces so as to surround four side surfaces of the lower-mold cavity block 7.

Figure 9:
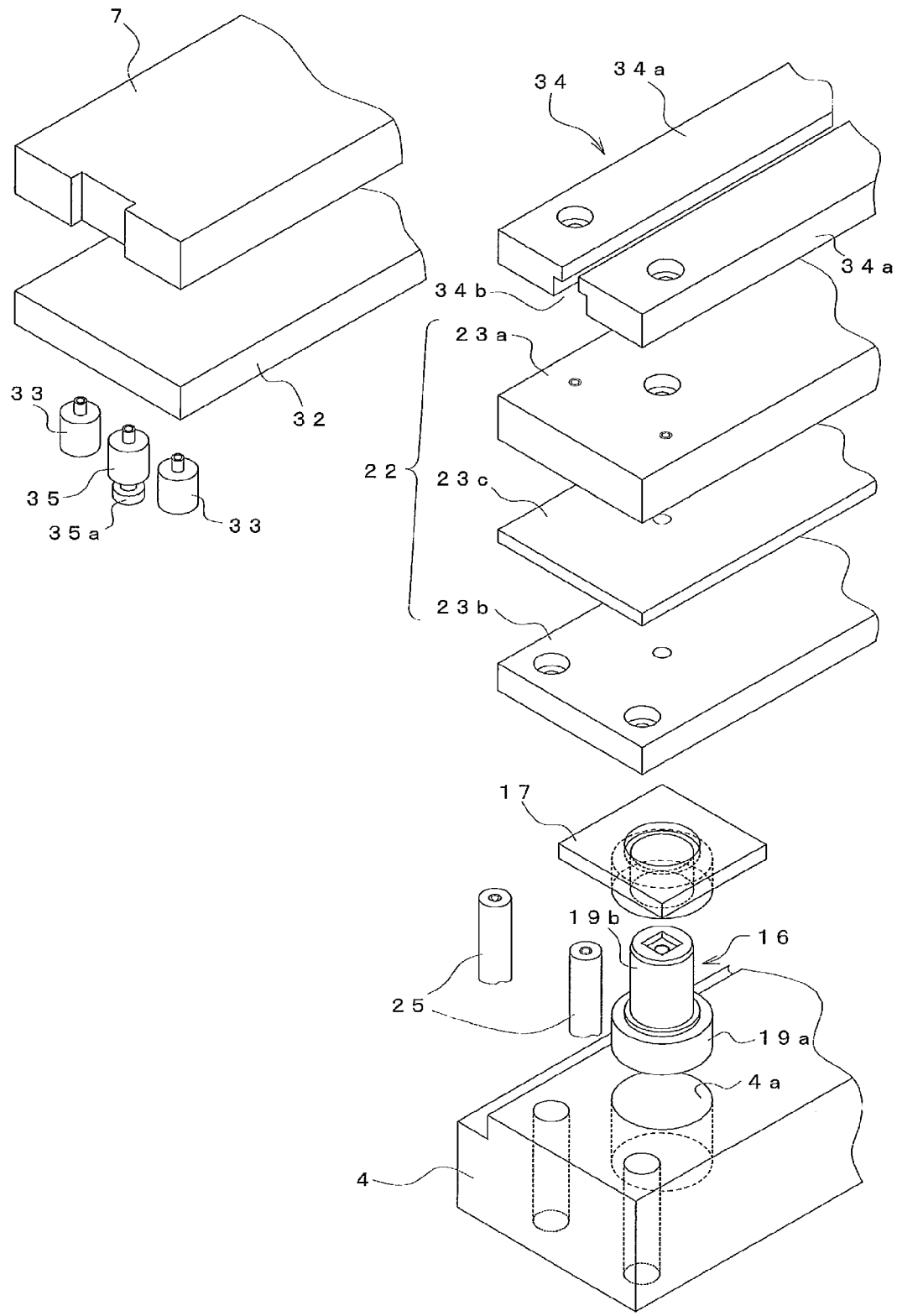
FIG. 9 is an exploded fragmentary perspective view of important parts of the lower mold set.

A link plate 34 is provided under a bottom surface of the lower-mold back plate 32 with lower-mold support pins 33 between, and the lower-mold back plate 32 and the link plate 34 are linked to each other by lower-mold link pins 35. As shown in FIG. 9, the link plate 34 is composed of a pair of link blocks 34a, which are fixed by screws onto a top surface of the connection block 22. Facing portions of the link blocks 34a fixed by the screws form a step-like groove 34b, and brim parts 35a of the lower-mold link pins 35 are laterally inserted therein so as to prevent vertical dropout.

Locating pins (not shown) are protruded from three sites on the top surface of the lower-mold cavity block 7 and can be engaged with location holes (not shown) formed on a substrate 70 so as to attain positioning of the substrate 70. There are provided lower-mold set blocks 37 on three sites on the top surface of the lower-mold cavity block 7. The lower-mold set blocks 37 are used for positioning with respect to the upper mold set 2 that will be described later. On the top surface of the lower-mold cavity block 7, the substrate 70 positioned by the locating pins is sucked and held through suction holes not shown.

(2 Upper Mold Set 2)

Figure 3:
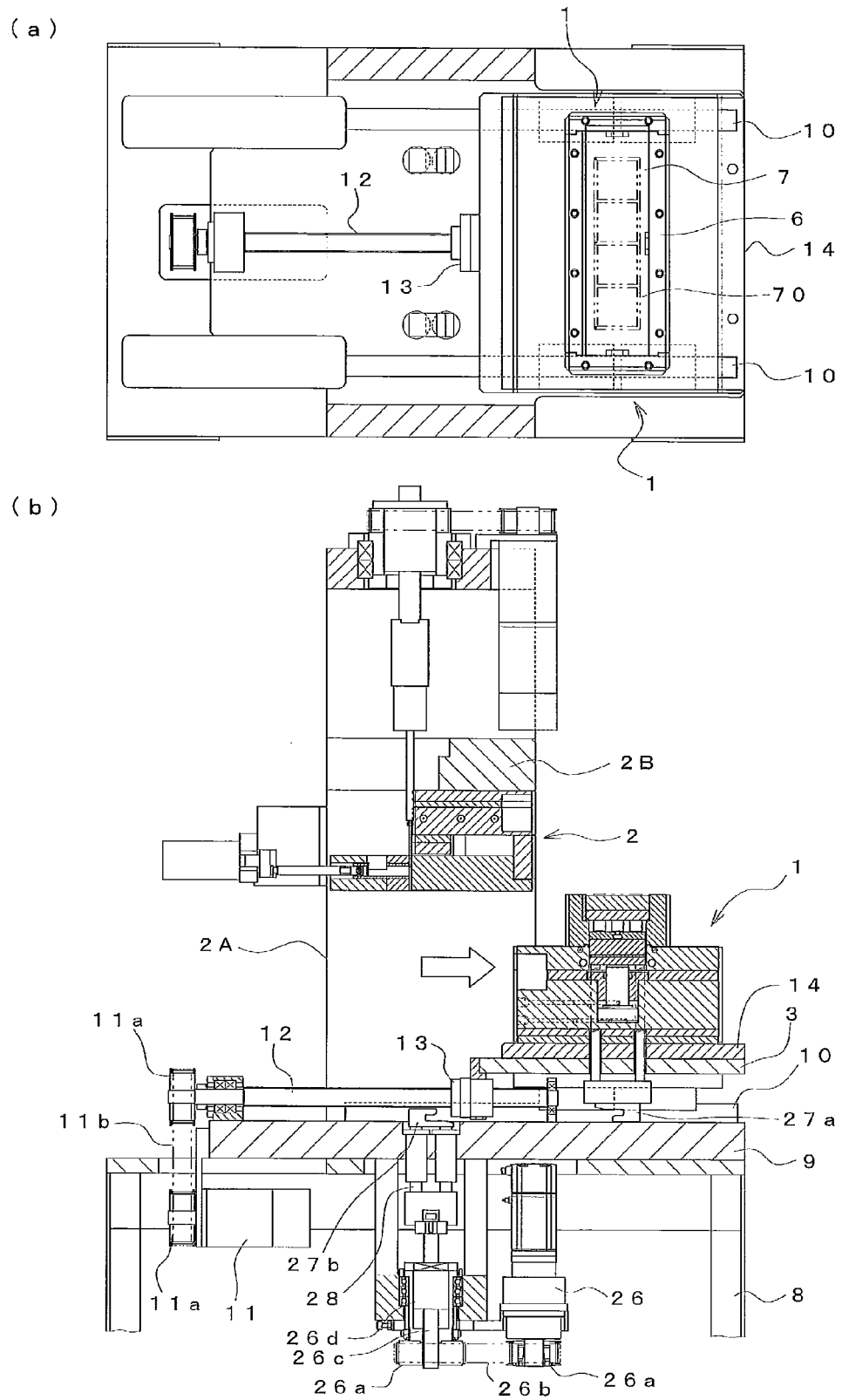
FIG. 3(a) is a plan view showing a state in which the lower mold set has been moved horizontally.
FIG. 3(b) is a front elevation in section showing the state.
Figure 6:
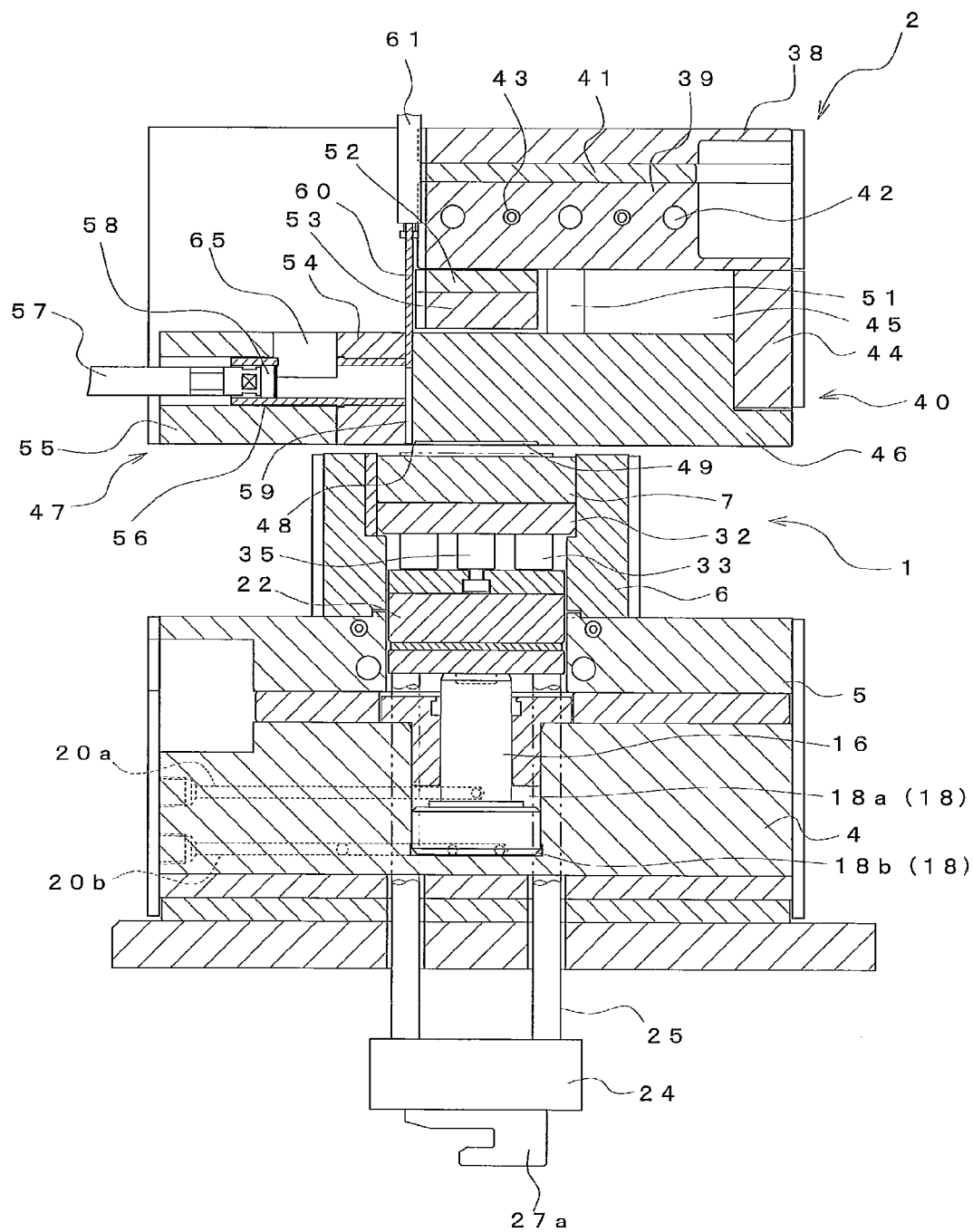
FIG. 6 is a front elevation in section showing a state prior to resin sealing that is performed by an upper mold set and the lower mold set.

In the upper mold set 2, as generally shown in FIGS. 3 and 6, an upper-mold clamp plate 38 and an upper-mold frame plate 39 are fixed onto a bottom surface of a support frame 2B fixed to a support frame 2A standing on the base plate 9, and an upper-mold chase 40 is removably mounted thereon.

(2-1 Upper-Mold Frame Plate 39)

The upper-mold frame plate 39 is fixed to the upper-mold clamp plate 38 through the upper-mold adiabatic plate 41. The upper-mold frame plate 39 contains upper-mold heaters 42 and upper-mold resistance temperature sensors 43. Herein the upper-mold heaters 42 are placed in three lines and the upper-mold resistance temperature sensors 43 are placed at two sites in each region between the upper-mold heaters 42 inside the side surfaces (at four sites in total).

As shown in FIG. 6, an upper-mold chase stopper block 44 and upper-mold chase guide blocks 45 are fixed onto a bottom surface of the upper-mold frame plate 39. The upper-mold chase stopper block 44 is placed along one side of the bottom surface of the upper-mold frame plate 39. The upper-mold chase guide blocks 45 are placed along two sides of the bottom surface of the upper-mold frame plate 39 so as to extend squarely from both ends of the upper-mold chase stopper block 44.

(2-2 Upper-Mold Chess 40)

As shown in FIG. 6, the upper-mold chase 40 has a configuration in which the upper-mold cavity block 46 and a resin supply block 47 are integrated.

(2-2-1 Upper-Mold Cavity Block 46)

The upper-mold cavity block 46 is generally shaped like a rectangular parallelopiped. Gates 48 and then recesses 49 rectangular in plan view are formed so as to extend continuously from an edge of the bottom surface of the block 46. The gates 48 may employ various forms such as side gate and film gate (film gates are used herein). The recesses 49, along with the lower-mold cavity block 7, form cavities when the molds are closed. On the upper-mold cavity block 46 are formed upper-mold set blocks, not shown, which correspond to the lower-mold set blocks 37 provided on the lower-mold cavity block 7.

As shown in FIG. 6, upper-mold support pins 51, an ejector plate 52, and a pin plate 53 integrated therewith are placed on a top surface of the upper-mold cavity block 46. Ejector pins not shown are supported by the ejector plate 52 and the pin plate 53. The ejector pins penetrate through the upper-mold cavity block 46. When the molds are closed, the ejector plate 52 and the pin plate 53 are moved up by return pins not shown so that extremity faces of the ejector pins are flush with surfaces of the recesses 49. The pin plate 53 is biased downward by springs not shown. When the molds are opened, therefore, the pin plate 53 is moved down by biasing forces of the springs so that resin products in the recesses 49 can be pushed out by the ejector pins.

(2-2-2 Resin Supply Block 47)

As shown in FIGS. 1 and 6, the resin supply block 47 has a sleeve holder 54, a sleeve block 55, a sleeve 56, a plunger rod 57, and a plunger tip 58.

The sleeve holder 54 is fixed with a side surface thereof in contact with a side surface of the upper-mold cavity block 46. On the side surface of the sleeve holder 54, groove-like recesses are formed in positions corresponding to the recesses 49 of the upper-mold cavity block 46. A pot part 59 is formed by the recesses and the side surface of the upper-mold cavity block 46. At center of the wall surface forming the recesses, a communication hole is formed and the sleeve 56 that will be described later is fitted therein. For the sleeve holder 54 is used powder high speed tool steel (having a hardness on the order of HRC 63).

In the pot part 59, a plunger plate 60 is moved up and down so that resin molten in the pot part 59 is pushed out into the cavities by the downward movement, as will be described later. The plunger plate 60 is shaped like a rectangular parallelopiped having a small width, and a groove is formed on whole periphery along a lower edge in vicinity of a lower end face thereof. The groove is used for retrieving resin residue produced during molding.

An upper end of the plunger plate 60 is linked to the plunger rod 61. For the plunger rod 61, a servo motor 62 causes rotation of a ball screw 63 through a pulley 62a and a timing belt 62b and thus a power is transmitted to the rod 61 through an isobaric device 64. Then the plunger plate 60 pushes out molten resin in the pot part 59, into the cavities, to fill them. A filling pressure of the molten resin is controlled so as to be of a constant predetermined value by the isobaric device 64. For the plunger plate 60 is used high speed tool steel (having a hardness on the order of HRC 59).

The sleeve block 55 is mounted onto a side surface of the sleeve holder 54. In the sleeve block 55, a communication hole that continues to the communication hole in the sleeve holder 54 is formed and the sleeve 56 is fitted therein. On a top surface of the sleeve block 55 are formed a resin input port 65 communicating with the communication hole. Herein a cylindrical resin tablet is inputted through the resin input port 65. It can be made possible, however, to input a rectangular resin tablet or granules, provided that a shape of an inner peripheral surface of the sleeve 56 is changed.

The sleeve 56, which is cylindrical, is fitted in the communication holes in the sleeve holder 54 and the sleeve block 55. On the sleeve 56 is formed an opening that communicates with the resin input port 65 in a state in which the sleeve 56 is fitted in the communication holes. For the sleeve 56 is used powder high speed tool steel (having a hardness on the order of HRC 68).

The plunger rod 57 can horizontally be reciprocated by an air cylinder 67 mounted on a bracket 66 provided in a lateral position with respect to the upper mold set 2.

As shown in FIG. 6, a plunger tip 58 shaped like a column is fixed to an extremity of the plunger rod 57 and can be reciprocated along the inner peripheral surface of the sleeve 56. On an outer peripheral surface of the plunger tip 58 in vicinity of an extremity thereof is formed an annular groove (not shown) having a function similar to that of the groove of the plunger plate 60 (i.e., retrieval of resin residue). For the plunger tip 58 is used cemented carbide (having a hardness on the order of HRC 74).

Provided that the reciprocation is caused by a servo motor in place of the air cylinder 67, moving velocity of the plunger tip 58 can be adjusted and thus resin can be supplied into and molten in the pot part 59 at an adequate velocity according to a type of the resin (e.g., difference in melting temperature and thermosetting speed). Provided that a limitation is set on a torque with which the servo motor brings the extremity face of the plunger tip 58 into contact with a side surface of the extremity of the plunger plate 60, exertion of a pressure that may obstruct an action of the plunger plate 60 can be prevented by the limitation.

(Method of Assembly)

The upper mold set 2 is assembled as follows.

That is, the upper-mold frame plate 39 is fixed to the upper-mold clamp plate 38 through medium of the upper-mold adiabatic plate 41, and the upper-mold chase stopper block and the upper-mold chase guide blocks 45 are fixed thereto. Then the upper-mold chase 40 is inserted from a lateral direction into a space formed between the upper-mold chase guide blocks 45. The upper-mold chase 40 can smoothly and horizontally be moved, while being guided in guide grooves (not shown), by guide parts (not shown) formed on the upper-mold chase guide blocks 45. Once being positioned at a predetermined location as a result of the horizontal movement, the upper-mold chase 40 is fixed by screws or the like.

The materials having high hardnesses are selected for the sleeve 56, the sleeve holder 54, the plunger tip 58, and the plunger plate 60 in order to improve wear resistance thereof, and limitation to the above-mentioned materials is thus unnecessary as far as materials having high hardnesses are used.

The sleeve holder 54 may be composed of material having low thermal conductivity and/or may have a sandwich structure including heat insulating material. This configuration represses thermal effect that is given to resin material in the sleeve 56. Specifically, a temperature difference of about 20° C. can be achieved between the cavities and the pot part 59. That is, thermosetting of molten resin can be prevented before the cavity is filled with the resin and occurrence of failure molding such as resin clogging at the gates and under-filling can effectively be prevented. Furthermore, finer temperature control can be achieved, providing that heaters are provided directly in the cavity block 46 and the sleeve holder 54.

(Operation)

Hereinbelow will be described operations of the resin sealing apparatus composed of the aforementioned configuration.

By operation of the first servo motor 11, as shown in FIG. 3, the lower mold set 1 is horizontally moved, through the ball screw 12, along the slide guides 10. Thus the lower mold set 1 is repositioned from the facing position where the lower mold set 1 resides under the upper mold set to the non-facing position where the lower mold set 1 resides sideways with respect to the upper mold set 2. On this occasion, the lower-mold cavity block 7 has been lowered by operation of the second servo motor 26.

Subsequently, a substrate 70 on which semiconductor devices are mounted is set on the top surface of the lower-mold cavity block 7. In this operation, the substrate 70 can accurately be positioned by simple engagement of the location holes of the substrate 70 with the locating pins (not shown) of the lower-mold cavity block 7.

Once the substrate 70 is set on the lower mold set 1, the lower mold set 1 is moved to the initial facing position by reverse operation of the first servo motor 11. For this operation, the upper-mold cavity block 46 and the lower-mold cavity block 7 have been heated, in advance, to predetermined temperatures by energization of the upper-mold heaters 42 and the lower-mold heaters 29.

Once the lower-mold cavity block 7 is moved to the position facing the upper-mold cavity block 46, the joints 27a and 27b are thereby linked to each other and the lower-mold cavity block 7 is then brought closer to the upper-mold cavity block 46 by reverse operation of the second servo motor 26. In the cylinder block 4, the liquid is supplied into the lower liquid chambers 18b through the lower piping 20b with a predetermined pressure and the liquid in the upper liquid chambers 18a is discharged through the upper piping 20a, so that the pistons 16 are moved up so as to perform mold clamping. The liquid chambers 18a communicate with each other and so do the liquid chambers 18b, so that forces with which the pistons 16 can clamp the substrate 70 through the lower-mold cavity block 7 are made uniform at all four sites. Even if there is a variation in thickness of the substrate 70 (especially, substrates made of resin), this configuration absorbs the variation in thickness by automatic adjustment of pressure contact positions of the lower-mold cavity block 7 and thereby achieves an adequate clamping condition. Therefore, occurrence of resin fins can be prevented in resin sealing that will be described later. On condition that a plurality of substrates 70 are simultaneously sealed with resin, the resin sealing can be performed with the plurality of substrates 70 simultaneously clamped by use of a plurality of divided cavity blocks 7.

Figure 7:
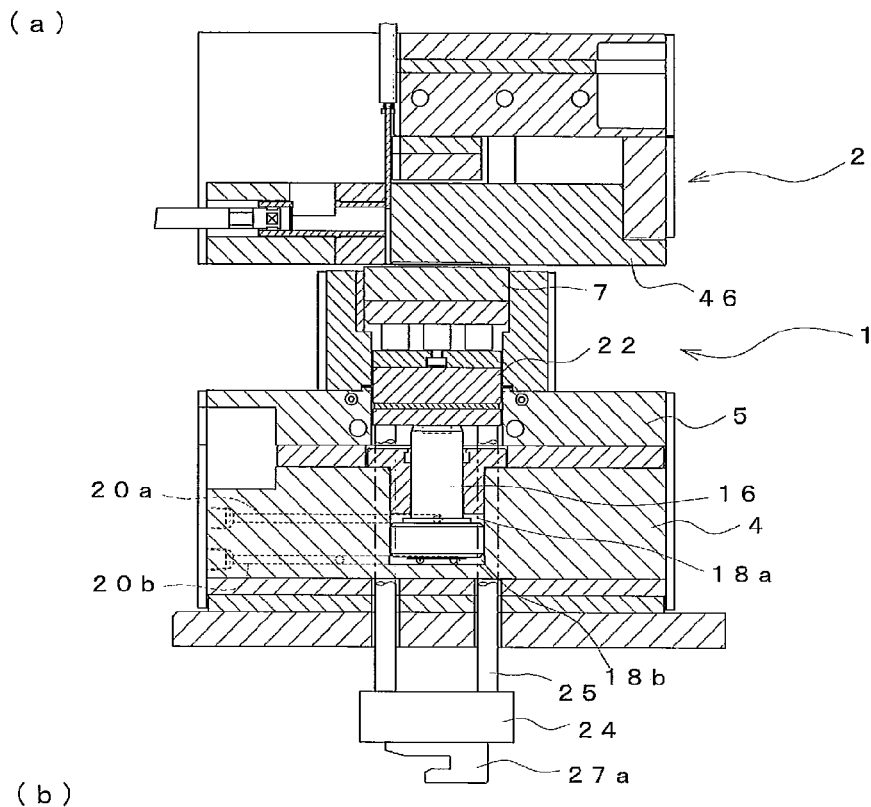
FIG. 7(a) shows a state in which the molds have been clamped in FIG. 6.
FIG. 7(b) shows a state in which resin has been supplied into a pot part.
Figure 7:
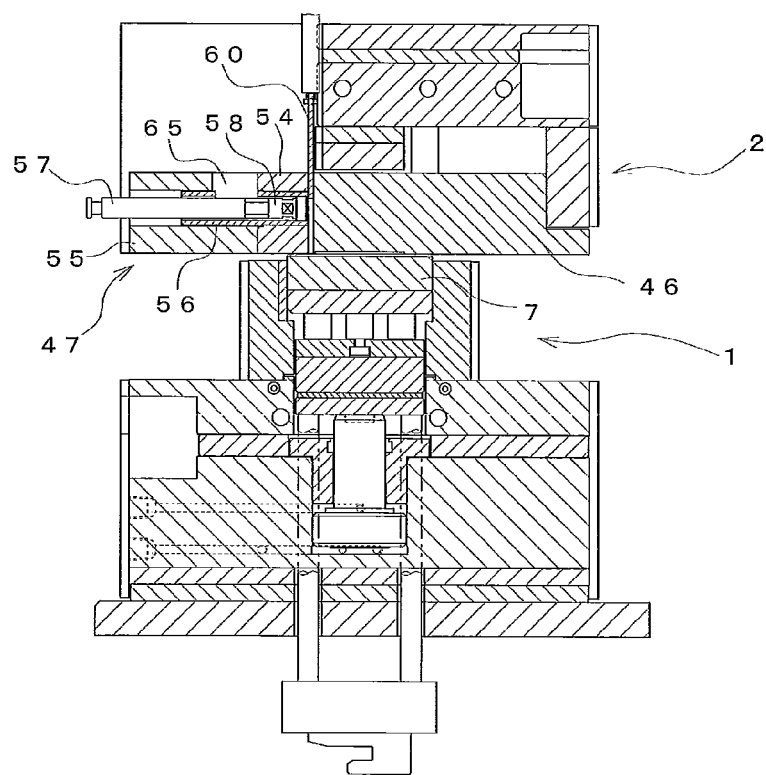

Subsequently, a resin tablet (which may be a commercial product) is supplied, by a resin material supply unit or the like not shown, through the resin input port 65 formed on the sleeve block 55 of the resin supply block 47. The supplied resin tablet is placed in the sleeve 56. As shown in FIG. 7(b), consequently, the air cylinder 67 is operated to horizontally move the plunger rod 57, so that the plunger tip 58 provided on the extremity thereof presses the resin tablet. The pressed resin tablet moves through the sleeve 56 and then reaches the pot part 59.

Inside of the sleeve 56 and inside of the adjoining pot part 59 have sufficiently been heated by the heaters and thus the resin tablet begins to melt. The molten resin is pressed by the plunger tip 58 to fill the pot part 59. The plunger tip 58 stops moving the moment that a part of the extremity face thereof comes into contact with the side surface of the extremity of the plunger plate 60.

Figure 8:
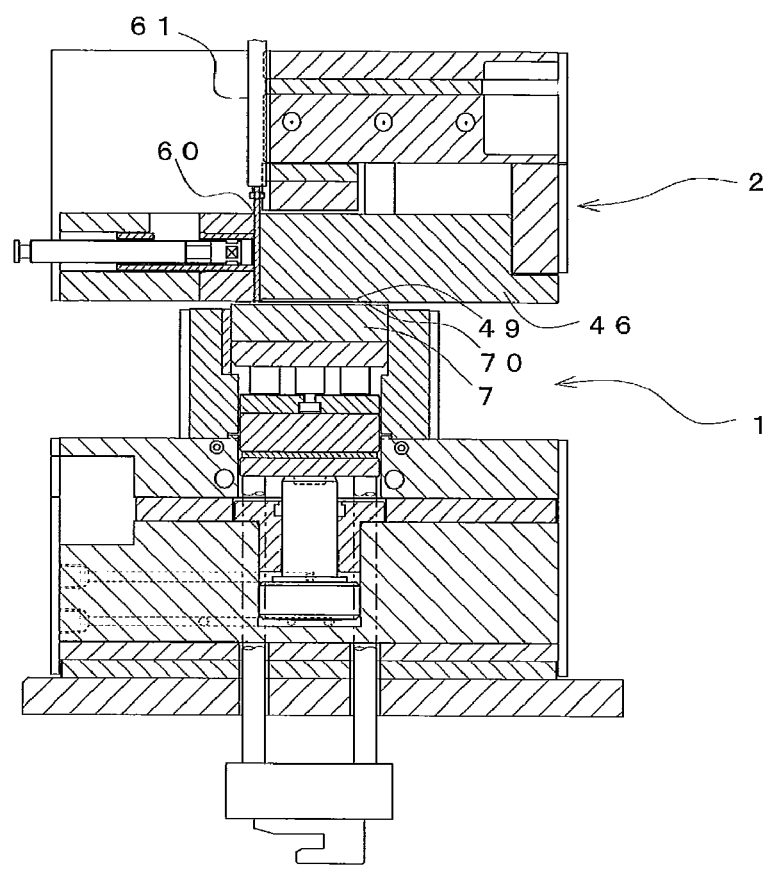
FIG. 8 shows a state in which a cavity has been filled with the resin in FIG. 7(b)

As shown in FIG. 8, the isobaric device 64 is thereafter operated to lower the plunger plate 60 through medium of the plunger rod 61. On this occasion, the extremity face of the plunger tip 58 has been positioned accurately with respect to the side surface of the plunger plate 60. Accordingly, the resin is thoroughly pushed down without residue on the extremity face of the plunger tip 58. Thus the molten resin in the pot part 59 is charged through the gates 48 into the cavities. The plunger plate 60 is stopped the moment that the extremity face thereof is lowered to a predetermined position higher than a depth of the gates. Then the molten resin is allowed to thermally set, and thus molded products are obtained.

After that, the liquid is discharged from the lower liquid chambers 18b for the pistons 16 and is supplied into the upper liquid chambers 18a, so that a mold clamping state produced by the pistons 16 is released. By operation of the second servo motor 26, on the other hand, the lower-mold cavity block 7 is lowered to open the molds. Even if the molded products tend to be held in the recesses 49 of the upper-mold cavity block 46, the products are pushed down by the ejector pins (not shown) biased by the springs and thus are reliably ejected onto the top surface of the lower-mold cavity block 7.

Then the lower mold set 1 is moved from the facing position to the non-facing position by operation of the first servo motor 11, and the molded products are conveyed by an unloader unit or the like not shown. In this operation, preferably, the groove (not shown) formed on the extremity part of the plunger plate 60 is cleaned with upward movement of the plate caused by actuation of the isobaric device 64 and/or the annular groove (not shown) formed on the extremity part of the plunger tip 58 is cleaned with retreat of the tip caused by actuation of the air cylinder 67, as required. Cleaning residue in the groove and/or the annular groove is preferably retrieved by cleaning devices not shown.

In the resin sealing apparatus, as described above, the setting of a substrate, the removal of molded products or the cleaning of the molds can be performed with the lower mold set 1 slid horizontally to the non-facing position. Thus not only can working be facilitated but also reduction in size (especially in vertical size) of the apparatus can be achieved. Besides, only the lower-mold cavity block 7 that is part of the lower mold set 1 is moved up and down, and therefore the cavity block 7 can be actuated with a reduced force and at a high velocity. In addition, a configuration for the actuation, i.e., the pistons, the vertical actuation mechanism (the second servo motor 26) and the like can be reduced in size. Moreover, mold clamping can be performed only by the pistons having a configuration that can be reduced not only in size but also in cost.

When observation or the like of surfaces of the molds is required in a molding process, the lower-mold cavity block 7 is moved down by operation of the second servo motor 26, through medium of the link bars 25, the connection block 22 and the link pins 35, as shown in FIGS. 6 and 7(a). Thus a sufficient clearance can be formed between the upper and lower mold sets 1 and 2, so that conditions of the molds can visually be checked.

On condition that molding is performed for different cavity shapes, the upper-mold chase 40 can be removed and replaced by another upper-mold chase 40 having an upper-mold cavity block 46 on which recesses for formation of corresponding cavities are formed. Thus component members other than the upper-mold chase 40 can be used in common, so that machining of various molded products can inexpensively be addressed by the replacement of only the upper-mold chase 40. In addition, the replacement of the upper-mold chase 40 can swiftly be addressed because that can simply be done by insertion of the chase 40 from a lateral direction into the space formed between the upper-mold chase guide blocks 45 and by slide of the chase with the guide grooves guided by the guide parts.

Second Embodiment

Figure 10A:
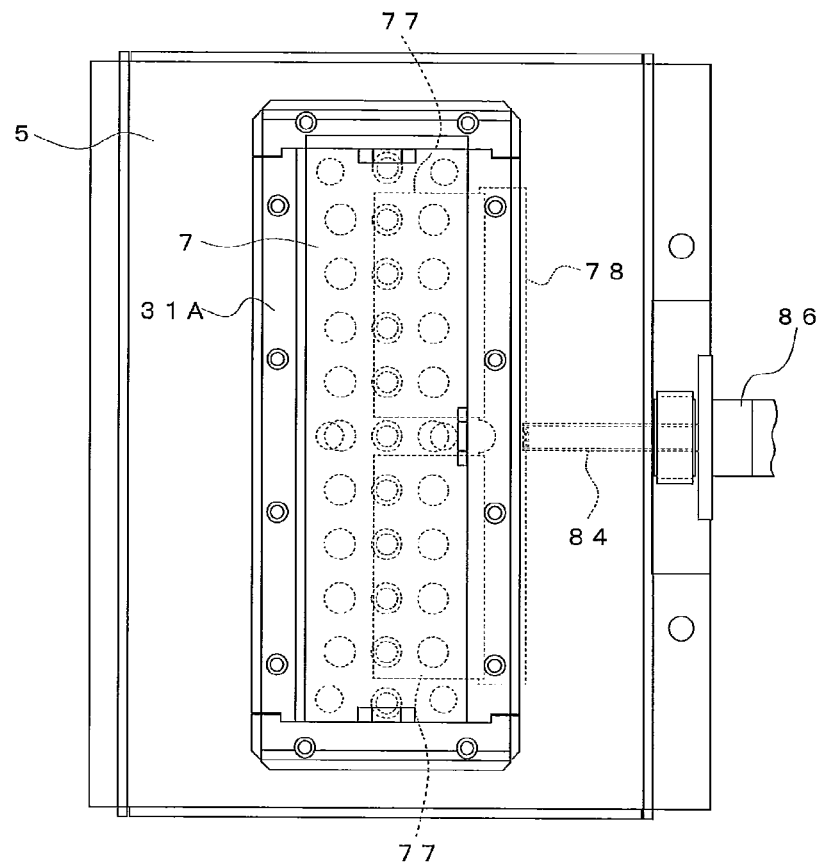
FIG. 10A is a plan view of a resin sealing apparatus in accordance with a second embodiment.
Figure 10B:
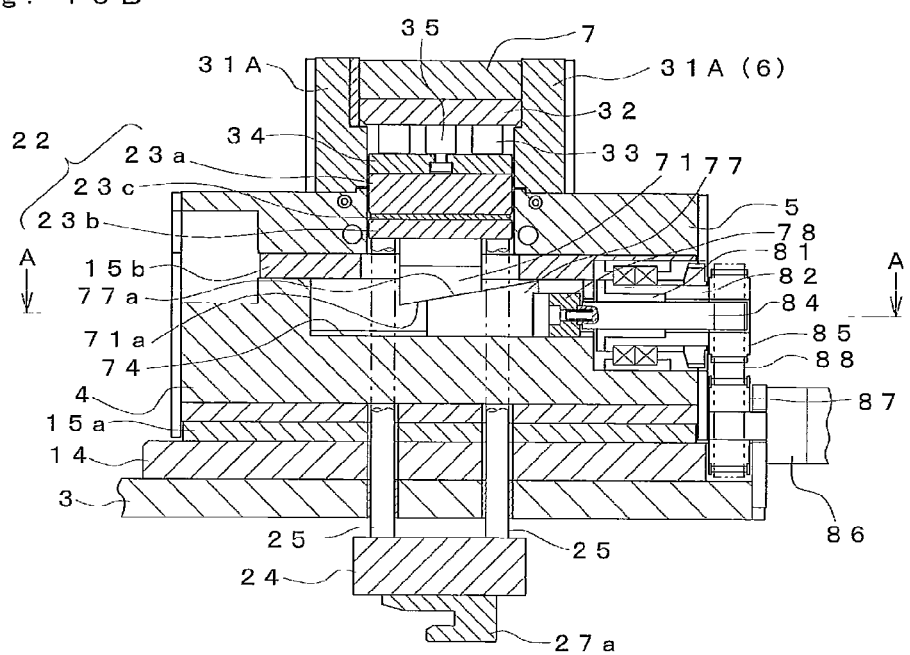
FIG. 10B is a sectional view of FIG. 10A.
Figure 11:
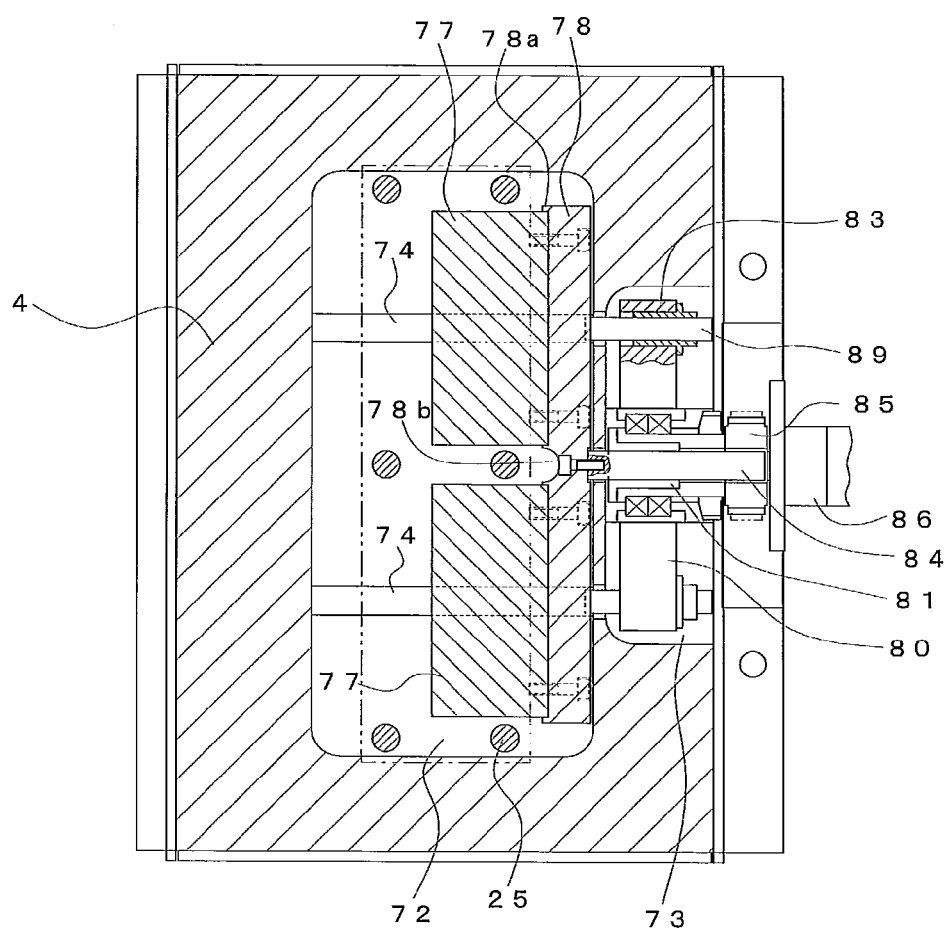
FIG. 11 is a sectional plan view showing a part below line A-A in FIG. 10B.

FIGS. 10A, 10B and 11 show a resin sealing apparatus in accordance with a second embodiment. The resin sealing apparatus is different from the embodiment described formerly in mechanism for moving up and down a lower-mold cavity block 7.

That is, a first taper block 71 is mounted on a connection plate 23b provided under the lower-mold cavity block 7. In the first taper block 71, a first slant surface 71a slanted relative to a horizontal plane is formed on a bottom face of a rectangular solid (in FIG. 10B, the slant surface is gradually slanted upward in a rightward direction).

On a top surface of a cylinder block 4, as shown in FIG. 11, a slide recess 72 rectangular in plan view is formed at center and an escape recess 73 is formed sideways with respect to the recess 72. In the slide recess 72, two protruded guides 74 extending in a direction of width of the recess (lateral direction in FIG. 11) are formed with a specified longitudinal spacing. Link bars 25 penetrate through a bottom surface of the slide recess 72 at six sites. The slide recess 72 and the escape recess 73 communicate with each other at center part and both side parts.

In the slide recess 72 are formed second taper blocks 77. In each of the second taper blocks 77, a second slant surface 77a is formed on a top face of a rectangular solid. The second slant surface 77a is slanted in the same direction and at the same angle as the first slant surface 71a of the first taper block 71. Horizontal reciprocation of the second taper block 77 brings the second slant surface 77a into slide contact with the first slant surface 71a. The second taper blocks 77 are provided at two sites with two center link bars 25 between. Each second taper block 77 is fixed by screws at two sites onto a slide block 78. On a front face (left side face in FIG. 11) of the slide block 78 are formed contact surfaces with which end surfaces of the second taper blocks 77 are to be brought into contact. On both side edges of the contact surfaces are protruded guide edges 78a for guiding the second taper blocks 77. Between the contact surfaces is formed a circular-arc escape groove 78b, which avoids interference with one of the two center link bars 25 when the slide block 78 is moved as will be described later. On bottom surfaces of the second taper blocks 77 and the slide block 78 that are integrated with each other, guide grooves are formed on which the protruded guides 74 formed in the slide recess 72 are to slide.

In the escape recess 73 is fixed a support block 80. A bearing part 82 having a nut 81 is provided at center part of the support block 80, and guide bushes 83 are provided in through holes formed in both end parts thereof.

A ball screw 84 is linked to center part of the slide block 78 by being screwed from a circular-arc surface formed by the escape groove 78b. The nut 81 is screwed on the ball screw 84 and is fixed to the bearing part 82. Thus the ball screw 84 is rotatably supported by the nut 81. A pulley 85 is integrated with one end of the bearing part 82. A belt 88 is stretched between the pulley 85 and a pulley 87 provided on a rotation shaft of a third servo motor 86, so that a driving force of the third servo motor 86 is transmitted to the nut 81. By advance and retreat of the ball screw 84 relative to the nut 81 in axial directions, in this configuration, the second taper blocks 77 can horizontally be reciprocated through medium of the slide block 78. Provided that an end part of the ball screw 84 is supported rotatably and slidably by bearings not shown, the rotation, advance and retreat of the ball screw 84 can be stabilized.

Guide shafts 89 are linked to both side parts of the slide block 78. The guide shafts 89 are slidably supported by the guide bushes 83. By the slidable support of the guide shafts 89 by the guide bushes 83, the reciprocation of the second taper blocks 77 and the slide block 78 can be stabilized.

Hereinbelow, operations of the resin sealing apparatus in accordance with the second embodiment will be described chiefly with reference to operations for moving up and down the lower-mold cavity block 7. Details that do not directly relate to the operations for moving up and down the lower-mold cavity block 7, however, are the same as those of the embodiment described formerly, and description thereof is therefore omitted.

By a vertical actuation mechanism (not shown in FIGS. 10A, 10B and 11), initially, the lower-mold cavity block 7 is moved up, so that the lower-mold cavity block 7 is brought closer to an upper-mold cavity block 46. In this operation, the first taper block 71 integrated with the lower-mold cavity block 7 also moves up. Then the third servo motor 86 is operated to horizontally move the second taper blocks 77, so that the second slant surfaces 77a of the second taper blocks 77 are kept in contact with or close to the first slant surface 71a of the first taper block 71.

Once the lower-mold cavity block 7 is made close to the upper-mold cavity block 46, the operation of moving up the lower-mold cavity block 7 that has been performed by the vertical actuation mechanism is stopped. On the other hand, the operation of the third servo motor 86 is continued, so that the second taper blocks 77 are horizontally moved further. Thus the second slant surfaces 77a of the second taper blocks 77 press the first slant surface 71a of the first taper block 71, and the lower-mold cavity block 7 is thereby moved further upward. Thus mold clamping is performed after a substrate is held between the upper-mold cavity block 46 and the lower-mold cavity block 7.

After the mold clamping, filling of resin is performed. Once molded products are finished, the second taper blocks 77 are made to retreat by reverse operation of the third servo motor 86. Thus the press of the second slant surfaces 77a on the first slant surface 71a is released. On the other hand, the molds are opened by reverse actuation of the vertical actuation mechanism and the molded products are taken out.

In the second embodiment, the operation that is performed by the vertical actuation mechanism for moving up the lower-mold cavity block 7 is stopped before the substrate is held. Accordingly, the vertical actuation mechanism is not required to exert so great force, and the mechanism that is small in size and inexpensive can be used. Besides, the lower-mold cavity block 7 can be moved up and down with the second slant surfaces 77a of the second taper blocks 77 in contact with the first slant surface 71a of the first taper block 71, so that not only the operation for moving up and down but also a suspension state can be stabilized. Furthermore, the embodiment requires neither liquid (such as oil) that is supplied to the pistons as in the embodiment described formerly nor provision of tightly sealed channels for the liquid. Therefore, the embodiment functions simply and at low cost, only by transmission of mechanical powers.

Third Embodiment

Figure 12A:
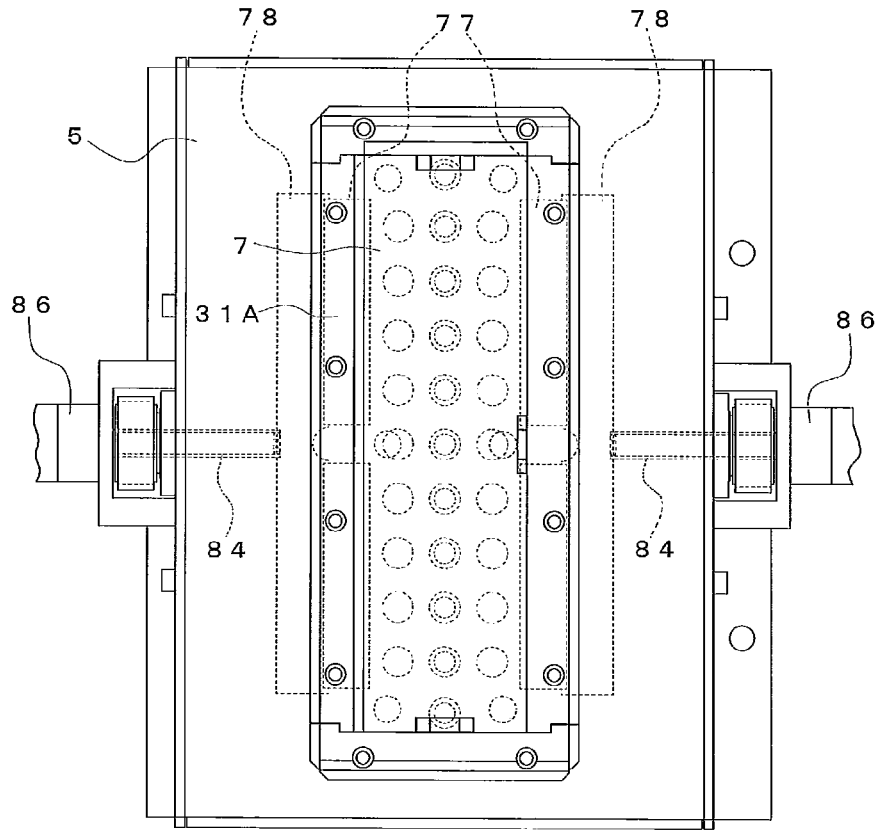
FIG. 12A is a plan view of a resin sealing apparatus in accordance with a third embodiment.
Figure 12B:
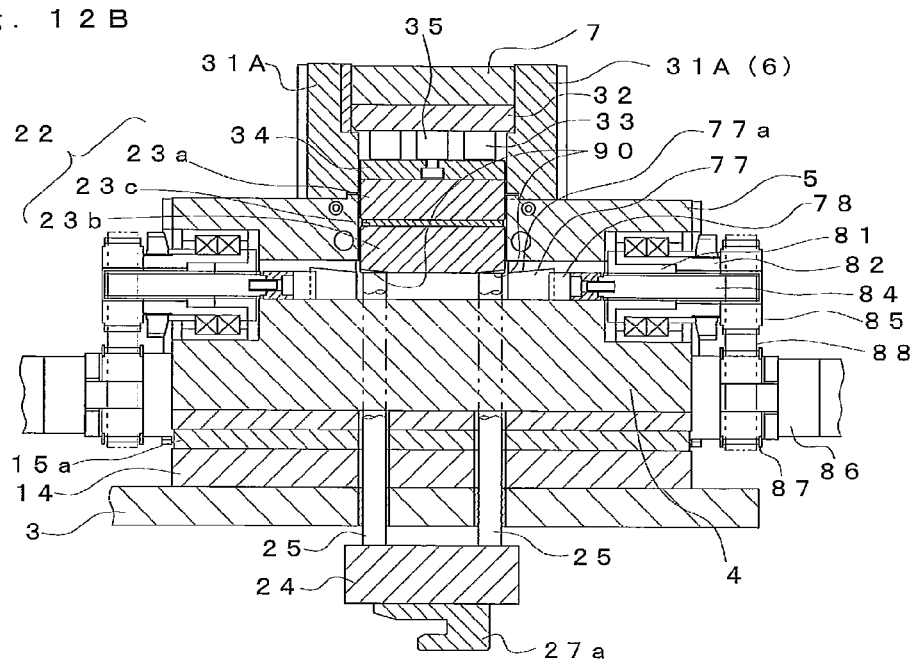
FIG. 12B is a sectional view of FIG. 12A.

FIGS. 12A and 12B show a resin sealing apparatus in accordance with a third embodiment. The resin sealing apparatus is different from the apparatus in accordance with the second embodiment chiefly in that second taper blocks 77 and mechanisms for actuation thereof are provided not only on one side but on both sides under a lower-mold cavity block 7. The same components as those in accordance with the second embodiment are designated by the same reference number and description thereof is omitted.

Namely, first slant surfaces 90 are formed on both side portions of a bottom face of a connection plate 23b. The second taper blocks 77 having second slant surfaces 77a that are to come into slide contact with the first slant surfaces 90 are provided on both sides of the lower-mold cavity block 7.

In the resin sealing apparatus in accordance with the third embodiment, the lower-mold cavity block 7 is moved up by a vertical actuation mechanism (not shown in FIGS. 12A and 12B) to a position in which a substrate is to be held between an upper-mold cavity block 46 and the lower-mold cavity block 7. After the substrate is held between both the cavity blocks 46 and 47, the second taper blocks 77 on both sides are horizontally moved in directions such that both are brought closer (a function of each second taper block 77 is the same as that in the second embodiment). Thus the second slant surfaces 77a of the second taper blocks 77 respectively come into slide contact with the first slant surfaces 90 formed on both the side portions of the bottom face of the connection plate 23b, and the lower-mold cavity block 7 is thereby moved upward so that mold clamping is performed.

In the third embodiment, in this manner, only mold clamping can be performed by the second taper blocks 77 and the actuation mechanisms for the blocks, so that a period of time required until completion of the mold clamping can be reduced. Besides, the lower-mold cavity block 7 can be moved up while being supported on both sides thereof by the second taper blocks 77. Thus the mold clamping operation of the lower-mold cavity block 7 can be stabilized. During the filling of resin, the second slant surfaces 77a of the second taper blocks 77 are respectively in contact with the first slant surfaces 90 formed on both the side portions of the bottom face of the lower-mold cavity block 7. Thus positional deviation of the lower-mold cavity block 7 can reliably be prevented, in comparison with the second embodiment.

Fourth Embodiment

Figure 13A:
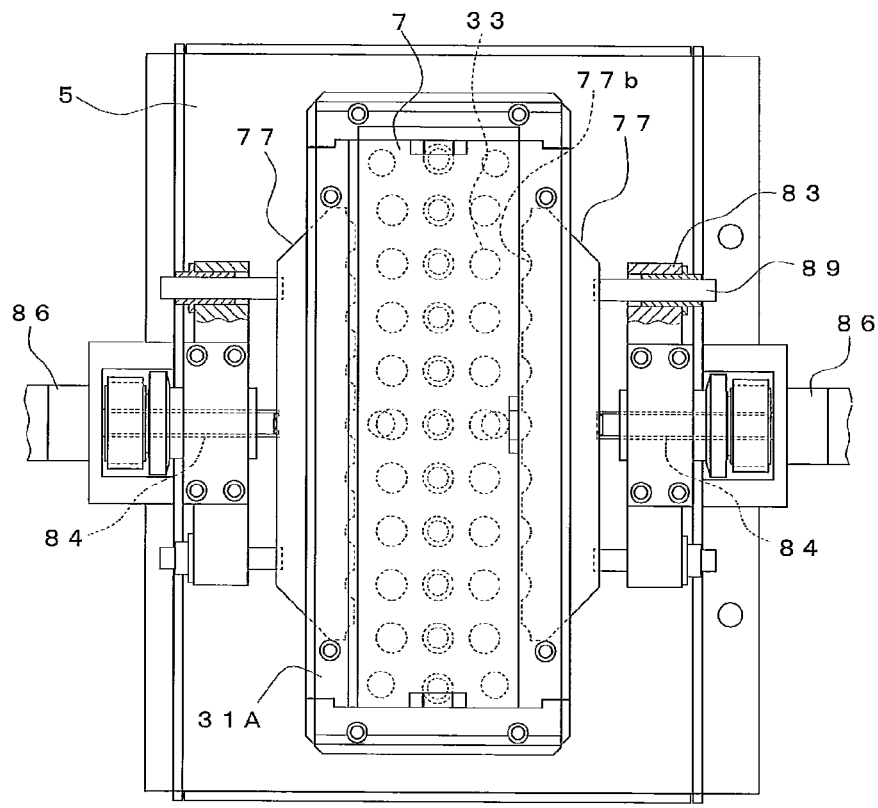
FIG. 13A is a plan view of a resin sealing apparatus in accordance with a fourth embodiment.
Figure 13B:
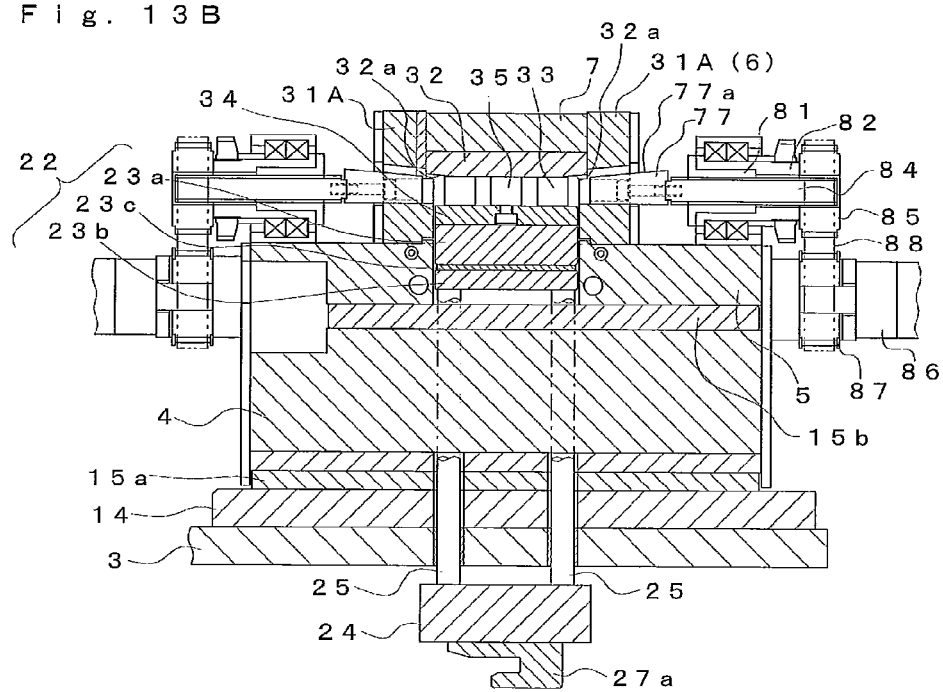
FIG. 13B is a sectional view of FIG. 13A.

FIGS. 13A and 13B show a resin sealing apparatus in accordance with a fourth embodiment. A difference between the resin sealing apparatus and the apparatus in accordance with the third embodiment is whether positions to be pushed up by the second taper blocks 77 are on the connection plate 23b or on a lower-mold back plate 32 integrated with a bottom surface of a lower-mold cavity block 7. Other configurations are the same as those in accordance with the third embodiment. Therefore, the corresponding parts are designated by the same reference number and description thereof is omitted.

Namely, first slant surfaces 32a are formed on both side portions of a bottom surface of the lower-mold back plate 32. On extremities of the second taper blocks 77 are formed a plurality of recesses 77b that avoid interference with lower-mold support pins 33.

Though the third servo motor 86 is used for the horizontal reciprocation of the second taper blocks 77 in the second through fourth embodiments, other actuation means such as air cylinder may be used.

Though the second taper blocks 77 on both sides are actuated by the separate third servo motors 86 in the third and fourth embodiments, there may be employed a configuration in which the blocks are actuated by one servo motor (not shown) with both pulleys 85, 85 interlocked by a rotation shaft not shown. This configuration makes it possible to synchronize movement of the second taper blocks 77 and to thereby move up and down the lower-mold cavity block 7 on more stable conditions.

In the third and fourth embodiments, the second taper blocks 77 may be configured so as to retreat from a zone in which the lower-mold cavity block 7 is moved up and down (elevation region). Thus the second taper blocks 77 may be advanced into the elevation region so as to bring the second slant surfaces 77a into contact with the first slant surfaces 32a the moment the lower-mold cavity block 7 is moved to a predetermined position close to the upper-mold cavity block 46.

What is claimed is:

1. A resin sealing apparatus comprising a first mold, and a second mold that can be brought into and released from contact with the first mold, wherein at least one substrate provided in both the molds and mounted with electronic components is subjected to resin sealing and molding by filling with molten resin material of cavities formed by both the molds, the second mold placed on a base plate so as to be capable of horizontally reciprocating, and comprising a cavity block that can be brought into and released from contact with the first mold and that is a part of the area opposed to the first mold, containing the cavity, and a mold clamping mechanism that brings and releases the cavity block into and from contact with the first mold so as to perform mold clamping, the base plate provided with a horizontal actuation mechanism for moving the second mold to a facing position where the second mold faces the first mold and to a non-facing position where the second mold has been moved sideways from the facing position, wherein the base plate comprises a vertical actuation mechanism that actuates the cavity block independently from the mold clamping mechanism so as to bring and release the cavity block into and from contact with the first mold at speeds higher than the mold clamping mechanism, and wherein the vertical actuation mechanism and the second mold comprise joints that become linked status in the facing position and that become unlinked status in the non-facing position.

2. A resin sealing apparatus as claimed in claim 1, wherein the mold clamping mechanism comprises at least one piston that supports the cavity block and that brings and releases the cavity block into and from contact with the first mold so as to perform mold clamping.

3. A resin sealing apparatus as claimed in claim 1, wherein the mold clamping mechanism comprises:

a first taper block provided on the cavity block and having a slant surface formed on a bottom face thereof, second taper blocks provided so as to be capable of horizontally reciprocating and having slant surfaces formed on top faces thereof that are to be in slide contact with the slant surface of the first taper block so as to move up and down the cavity block through the first taper block, and actuation means for horizontally reciprocating the second taper blocks.

4. A resin sealing apparatus as claimed in claim 1, wherein the cavity block is shaped like a rectangular parallelopiped having four side surfaces, and wherein the second mold comprises a holder base having guide surfaces that guide the four side surfaces of the cavity block in a slidable manner.

5. A resin sealing apparatus as claimed in claim 4, wherein the holder base comprises an adjustment plate that forms the guide surfaces and that is composed of separate members.

6. A resin sealing apparatus as claimed in claim 2, wherein the cavity block is composed of a plurality of blocks supported by at least one piston.

7. A resin sealing apparatus as claimed in claim 1, wherein the first mold and the second mold have a constitution such that together they can mold the substrate for one molded product.

8. A resin sealing apparatus as claimed in claim 1, wherein either one of the molds comprises a pot part for melting resin material, and wherein the pot part has openings that are formed so as to face the substrates provided in both the molds.

* * * * *